US012628292B2

(12) United States Patent
Lu et al.

(10) Patent No.: US 12,628,292 B2
(45) Date of Patent: May 12, 2026

(54) SUPPORT FRAME

(71) Applicant: Qisda Corporation, Taoyuan City (TW)

(72) Inventors: Kuang-Heng Lu, Taoyuan City (TW); Tsung-Han Lin, Taoyuan City (TW)

(73) Assignee: Qisda Corporation, Taoyuan City (TW)

( * ) Notice: Subject to any disclaimer, the term of this patent is extended or adjusted under 35 U.S.C. 154(b) by 149 days.

(21) Appl. No.: 18/768,012

(22) Filed: Jul. 10, 2024

(65) Prior Publication Data

US 2025/0056739 A1      Feb. 13, 2025

(30) Foreign Application Priority Data

Aug. 9, 2023      (CN) .......................... 202311000040.1

(51) Int. Cl.
H05K 5/02      (2006.01)
(52) U.S. Cl.
CPC .................................. H05K 5/0217 (2013.01)
(58) Field of Classification Search
CPC ................................................... H05K 5/0217
See application file for complete search history.

(56) References Cited

U.S. PATENT DOCUMENTS 9,671,830 B2 *      6/2017      Chen ..................... F16M 13/005
2019/0212773 A1 *      7/2019      Jiang ....................... G06F 1/166

FOREIGN PATENT DOCUMENTS

CN            104806110            7/2015
CN            105089349            11/2015
CN            216658021            6/2022

* cited by examiner

*Primary Examiner* — Jerry Wu
(74) *Attorney, Agent, or Firm* — JCIPRNET

(57) ABSTRACT

A support frame includes a movable element, a switch assembly and an elastic assembly. The movable element includes a body and cavities. The switch assembly includes a main body, a cam and a button. When the elastic assembly pushes the switch assembly so that the switch assembly in a first position, the cam rotates on a vertical plane or a horizontal plane and is inserted into at least one cavities of the movable element to limit the rotation of the movable element relative to the electronic body. When the switch assembly linearly moves to a second position by resisting an elastic force of the elastic assembly, the cam rotates on the vertical plane or the horizontal plane and breaks away from at least one cavities of the movable element, so that the movable element rotates relative to the electronic body to expand or close to the electronic body.

19 Claims, 19 Drawing Sheets

SUPPORT FRAME

CROSS-REFERENCE TO RELATED APPLICATION

This application claims the priority benefit of China application serial no. 202311000040.1, filed on Aug. 9, 2023. The entirety of the above-mentioned patent application is hereby incorporated by reference herein and made a part of this specification.

BACKGROUND

Technical Field

The disclosure relates to a support frame, and particularly relates to a support frame suitable for supporting an electronic body.

Description of Related Art

Generally, regarding a support frame used to support monitors, tablets, or mobile phones, the movable element (i.e. the leg of the frame) thereof merely has a simple opening and closing function but cannot prevent the movable element from being opened when closed, or from being closed when opened. If to use a hinge-type movable element in order to prevent the above-mentioned events from happening, then a large space is required and the cost is expensive, which has the disadvantages of being large in size and high in cost.

SUMMARY

The disclosure provides a support frame, which is suitable for supporting an electronic body and allows a movable element to be fixed in a specific expanded or closed position, and has the advantages of being small in size and low in cost.

The support frame according to the disclosure is suitable for supporting an electronic body. The support frame includes a movable element, a switch assembly and an elastic assembly. The movable element includes a body and a plurality of cavities. The plurality of cavities are separated from each other and located on the body, an end of the body is pivotally connected to the electronic body and located in the electronic body. The switch assembly includes a main body, a cam and a button. The main body and the cam are disposed inside the electronic body and located on a configuration plane of the electronic body. The cam is slidably disposed on the main body or located next to the main body, and the button is connected to the main body and exposed on the electronic body. The elastic assembly is disposed in the electronic body and at least connected between the switch assembly and the electronic body. When the elastic assembly pushes the switch assembly so that the switch assembly is in a first position, the cam rotates on a vertical plane perpendicular to the configuration plane or a horizontal plane parallel to the configuration plane and is inserted into at least one of the plurality of cavities of the movable element to limit rotation of the movable element relative to the electronic body. When the switch assembly linearly moves to a second position by resisting an elastic force of the elastic assembly, the cam rotates on the vertical plane or the horizontal plane and breaks away from at least one of the plurality of cavities of the movable element, so that the movable element rotates relative to the electronic body to expand or close to the electronic body.

In an embodiment according to the disclosure, the configuration plane of the electronic body has an opening, the button passes through the opening and is exposed on the electronic body, and the button is suitable for moving parallel to the configuration plane within the opening.

In an embodiment according to the disclosure, the electronic body further includes a limiting cavity, the switch assembly is born within the limiting cavity, and the limiting cavity limits movement of the switch assembly within the opening.

In an embodiment according to the disclosure, the button has a rounded surface or a chamfered surface.

In an embodiment according to the disclosure, the plurality of cavities include a first cavity and a second cavity, an included angle is between the first cavity and the second cavity, and the included angle is greater than or equal to 90 degrees.

In an embodiment according to the disclosure, the main body of the switch assembly has a pair of sliding slots and a pair of configuration slots. An extending direction of the pair of the sliding slots is inclined at an angle relative to the configuration plane. An orthographic projection of the pair of configuration slots on the configuration plane does not overlap an orthographic projection of the pair of sliding slots on the configuration plane.

In an embodiment according to the disclosure, the cam includes a first link, a second link, a linking portion, a connection portion and a cam portion. The first link is slidably installed in the pair of sliding slots, and the second link is disposed in the pair of configuration slots. The linking portion connects the first link and the second link, and the connection portion connects the second link and the cam portion.

In an embodiment according to the disclosure, when the support frame is in a closed state, the switch assembly is in the first position, the first link is in a third position of the pair of sliding slots, and the cam portion is inserted into the first cavity of the movable element.

In an embodiment according to the disclosure, when the support frame is in an opening process, the switch assembly linearly moves to the second position by resisting the elastic force of the elastic assembly, the first link slides from the third position to a fourth position along the pair of sliding slots, and links the cam portion to rotate on the vertical plane with the second link as an axis to break away from the first cavity, so that the movable element rotates relative to the electronic body and gradually expands from the electronic body.

In an embodiment according to the disclosure, when the support frame is an open state, the elastic assembly pushes the switch assembly so that the switch assembly is in the first position, the first link slides from the fourth position to the third position along the pair of sliding slots, links the cam portion to rotate on the vertical plane with the second link as the axis to insert into the second cavity of the movable element, and the movable element expands from the electronic body to support the electronic body.

In an embodiment according to the disclosure, when the support frame is a closing process, the switch assembly linearly moves to the second position by resisting the elastic force of the elastic assembly, the first link slides from the third position to the fourth position along the pair of sliding slots, and links the cam portion to rotate on the vertical plane with the second link as the axis to break away from the second cavity, so that the movable element rotates relative to the electronic body and gradually closes in the electronic body.

In an embodiment according to the disclosure, the elastic assembly includes two elastic elements, and each of the two elastic elements is a spring.

In an embodiment according to the disclosure, the elastic assembly includes two first elastic elements and a second elastic element, the two first elastic elements are connected between the main body of the switch assembly and the electronic body, and the second elastic element is connected to the cam of the switch assembly.

In an embodiment according to the disclosure, the support frame further includes two fixing elements, wherein the cam includes two cam portions located next to the main body. The second elastic element spans the main body and connects the two cam portions, and the two fixing elements respectively fix the two cam portions and the second elastic element on the configuration plane.

In an embodiment according to the disclosure, the switch assembly further includes two protruding portions connected to opposite sides of the main body and located between the main body and the two cam portions. The plurality of cavities include two cavities located on opposite sides of the main body and disposed corresponding to the two cam portions.

In an embodiment according to the disclosure, when the support frame is in a closed state, the switch assembly is in the first position, the two cam portions are respectively inserted into the two cavities of the movable element, and the movable element is contained in a containing cavity of the electronic body.

In an embodiment according to the disclosure, when the support frame is in an opening process, the switch assembly linearly moves to the second position by resisting a first elastic force of the two first elastic elements, the two protruding portions respectively push the two cam portions, so that the two cam portions resist a second elastic force of the second elastic element and respectively rotate on the horizontal plane with the two fixing elements as axis to break away from the two cavities, so that the movable element rotates relative to the electronic body and gradually expands from the electronic body.

In an embodiment according to the disclosure, when the support frame is an open state, the two first elastic elements push the switch assembly so that the switch assembly is in the first position, the two cam portions rotate on the horizontal plane with the two fixing elements as the axes through the second elastic force of the second elastic element and are inserted into the two cavities of the movable element, so that the movable element expands from the electronic body to support the electronic body.

In an embodiment according to the disclosure, when the support frame is a closing process, the switch assembly linearly moves to the second position by resisting the first elastic force of the two first elastic elements, the two protruding portions respectively push the two cam portions, so that the two cam portions resist the second elastic force of the second elastic element and respectively rotate on the horizontal plane with the two fixing elements as axis to break away from the two cavities, so that the movable element rotates relative to the electronic body and gradually closes in the electronic body.

In an embodiment according to the disclosure, the two first elastic elements and the second elastic element are respectively a spring.

Based on the above, in the design of the support frame according to the disclosure, when the elastic assembly pushes the switch assembly so that the switch assembly is in a first position, the cam rotates on a vertical plane perpendicular to the configuration plane or a horizontal plane parallel to the configuration plane and is inserted into at least one cavities of the movable element to limit rotation of the movable element relative to the electronic body; and when the switch assembly linearly moves to a second position by resisting an elastic force of the elastic assembly, the cam rotates on the vertical plane or the horizontal plane and breaks away from at least one cavities of the movable element, so that the movable element rotates relative to the electronic body to expand or close to the electronic body. That is to say, in the support frame according to the disclosure, the movable element can be fixed in a specific expanded or closed position through the elastic assembly accumulating and releasing the mechanical energy, thereby achieving the purpose of being small in size and low in cost.

In order to make the above features and advantages of the disclosure more comprehensible, the embodiments are described in detail with the accompanying drawings.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1A:
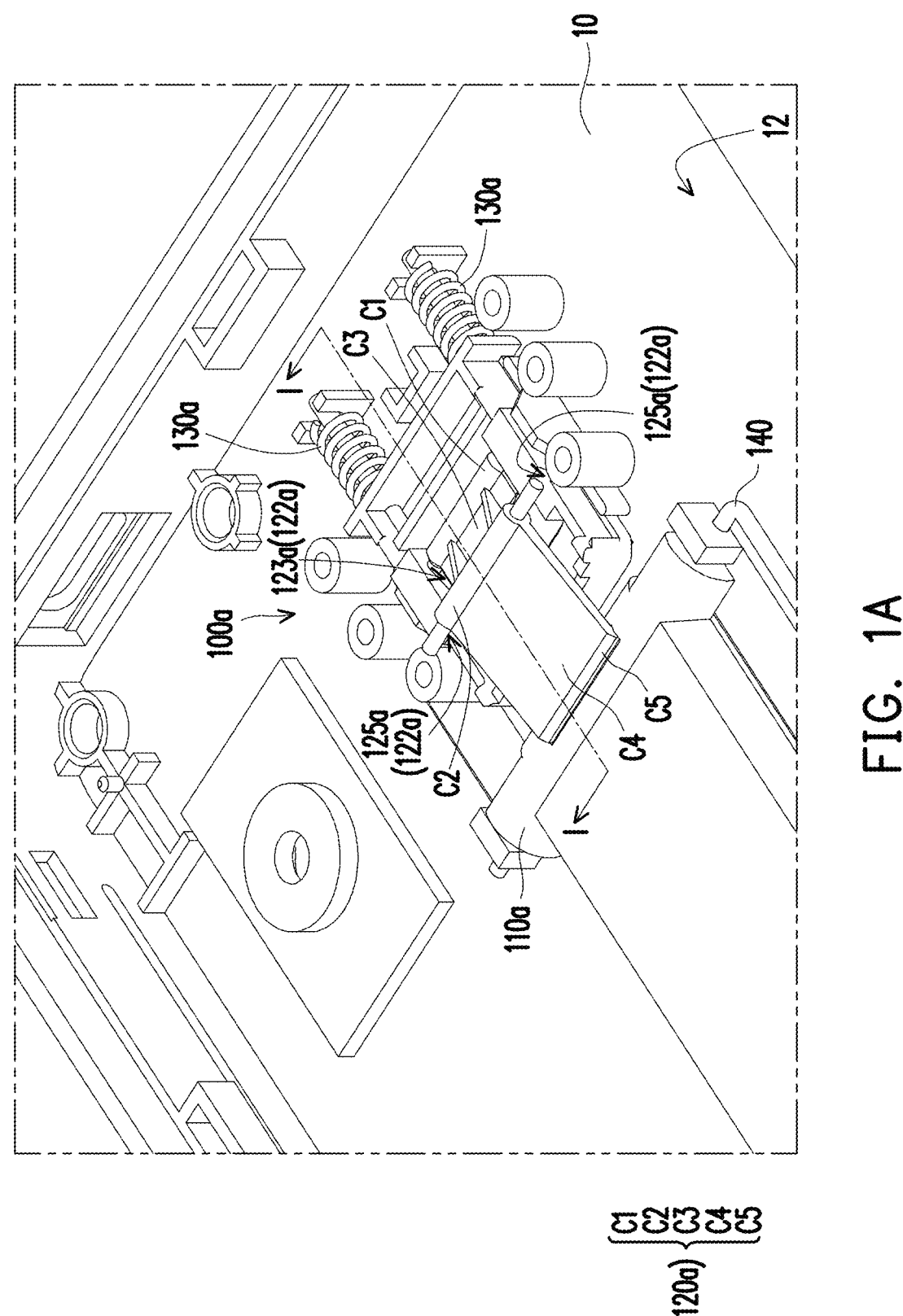
FIG. 1A is a schematic three-dimensional view of a support frame supporting an electronic body according to an embodiment of the disclosure.
Figure 1B:
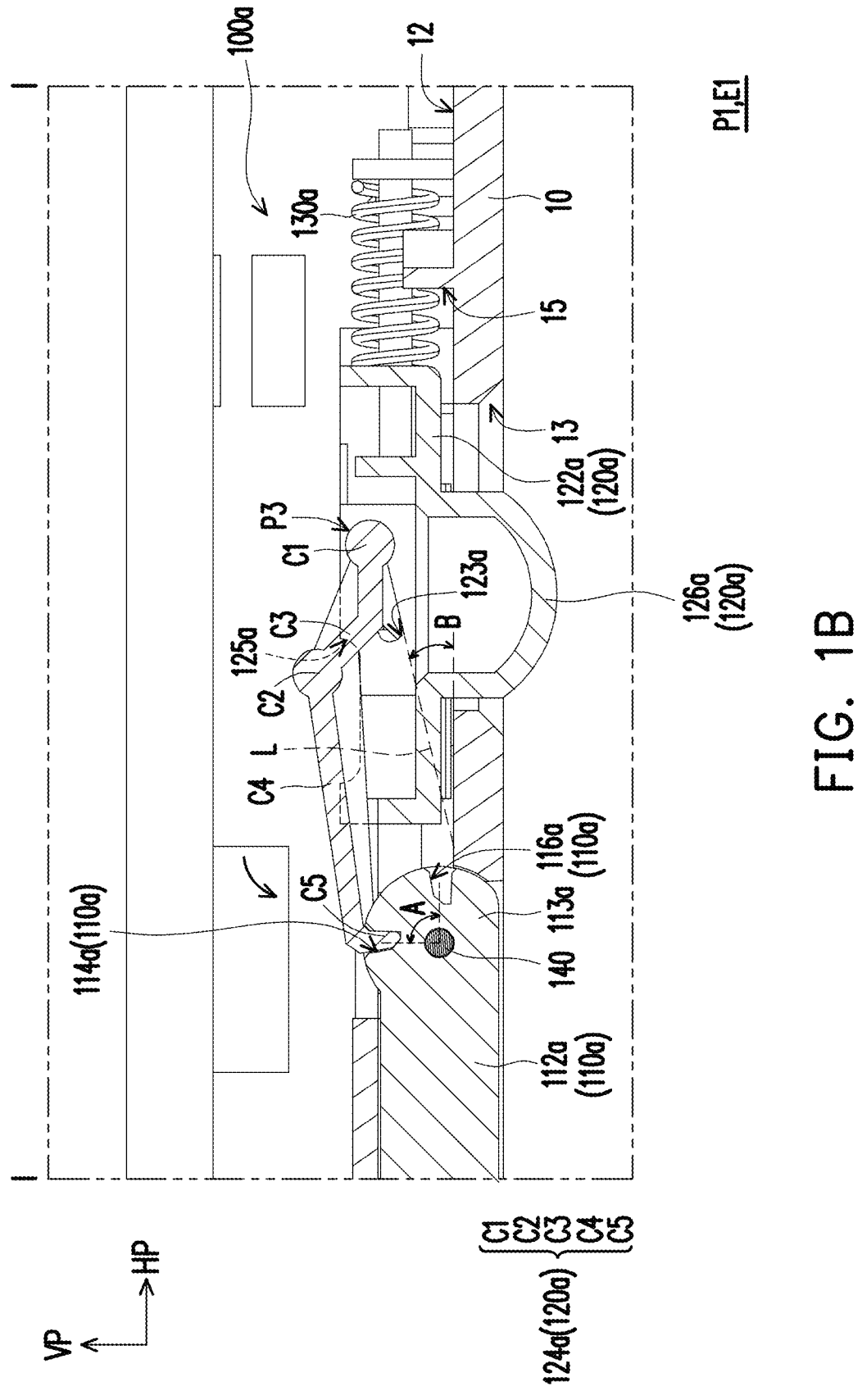
FIG. 1B is a schematic cross-sectional view of the support frame in the closed state along the line I-I in FIG. 1A.
Figure 1C:
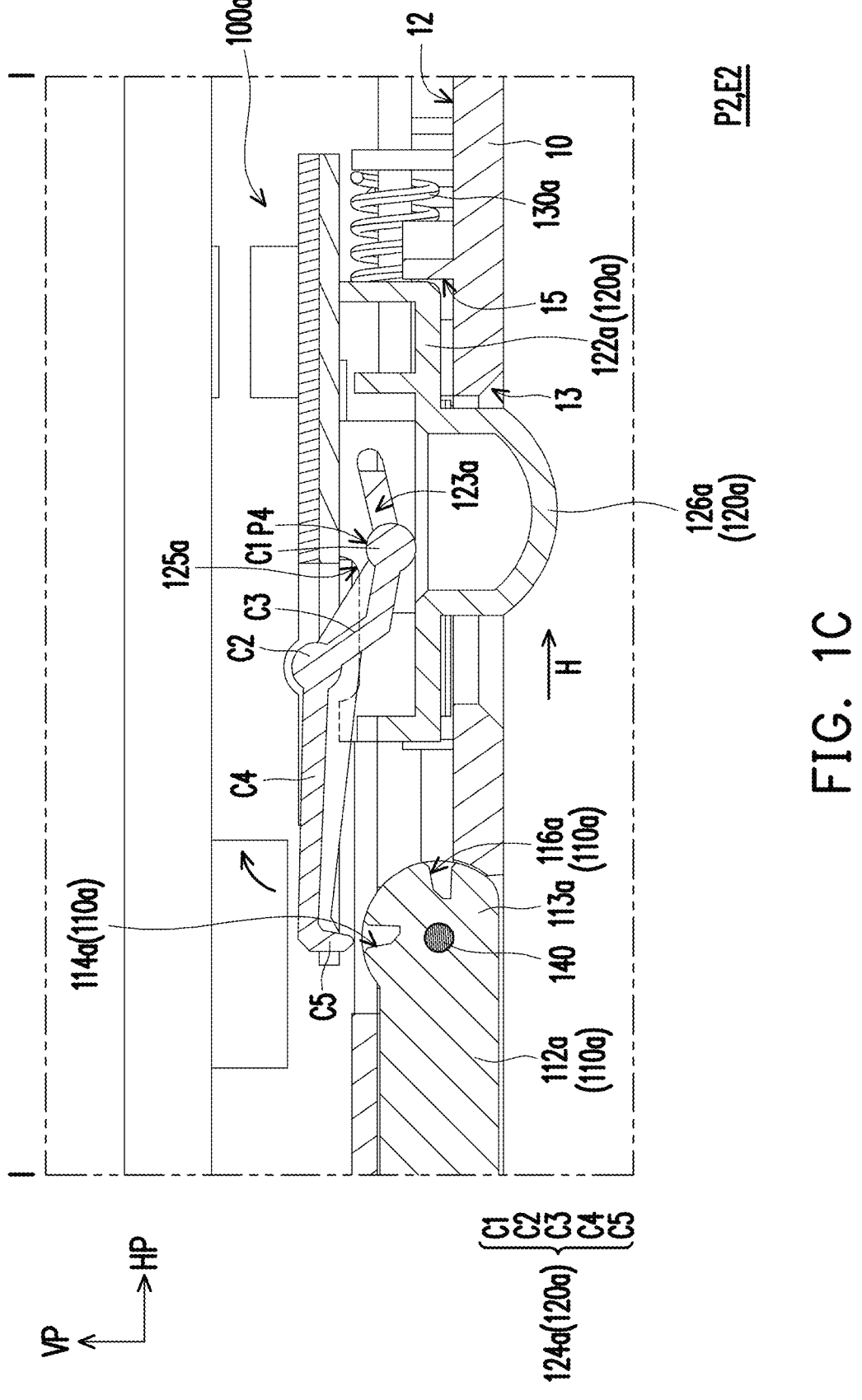
FIG. 1C and FIG. 1D are schematic cross-sectional views of the support frame in the opening process along the line I-I in FIG. 1A.
Figure 1D:
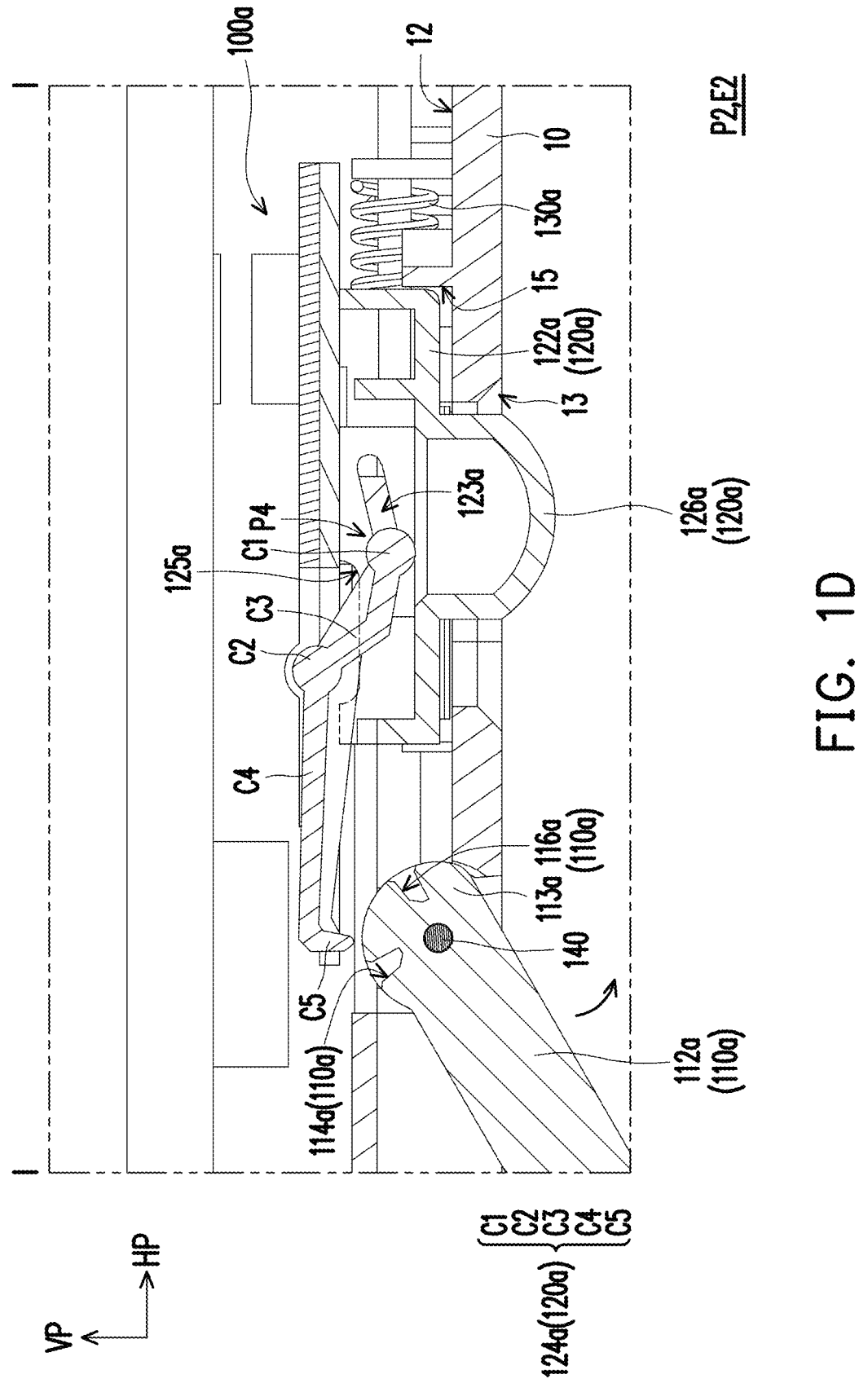
Figure 1E:
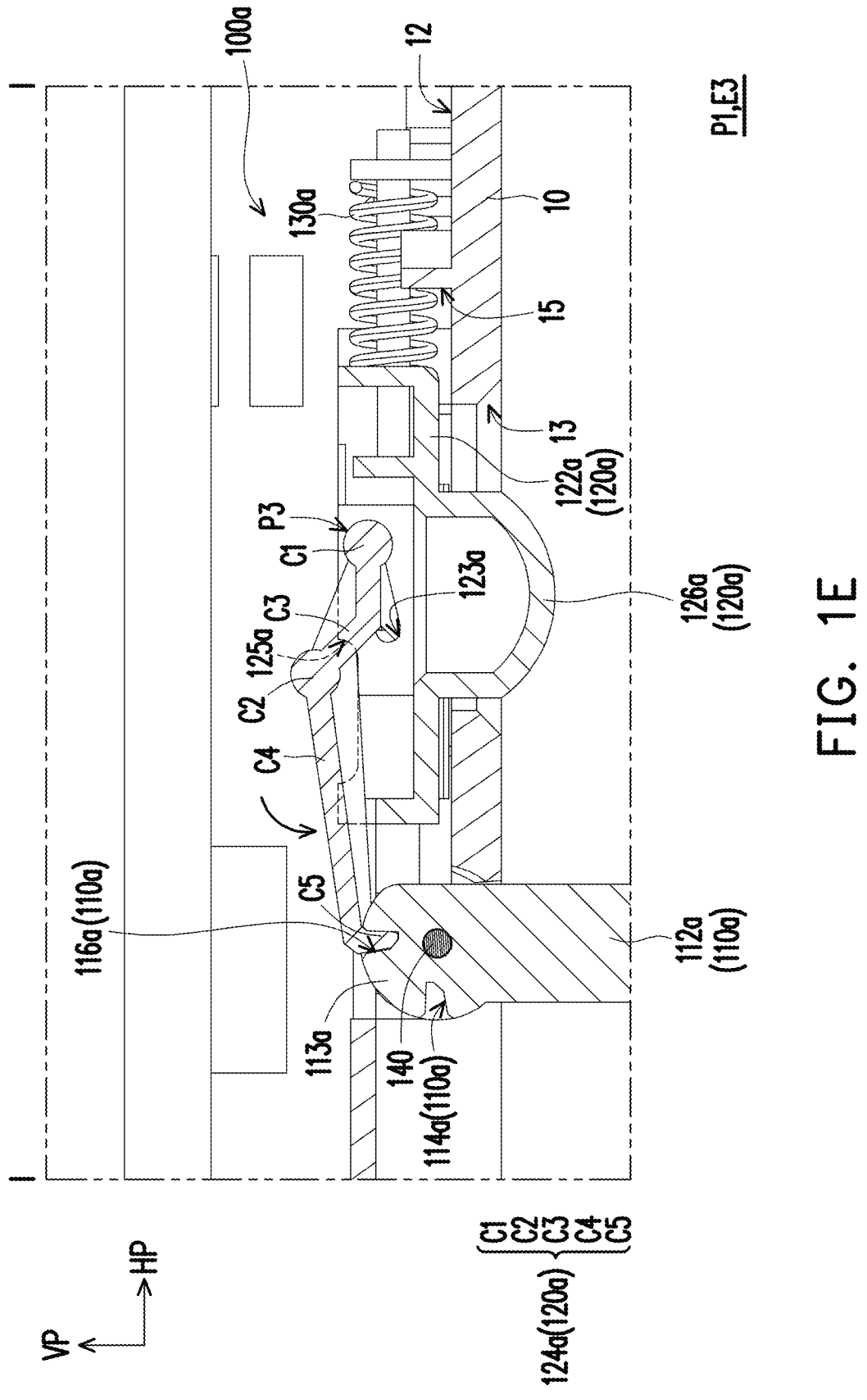
FIG. 1E is a schematic cross-sectional view of the support frame in the open state along the line I-I in FIG. 1A.
Figure 1F:
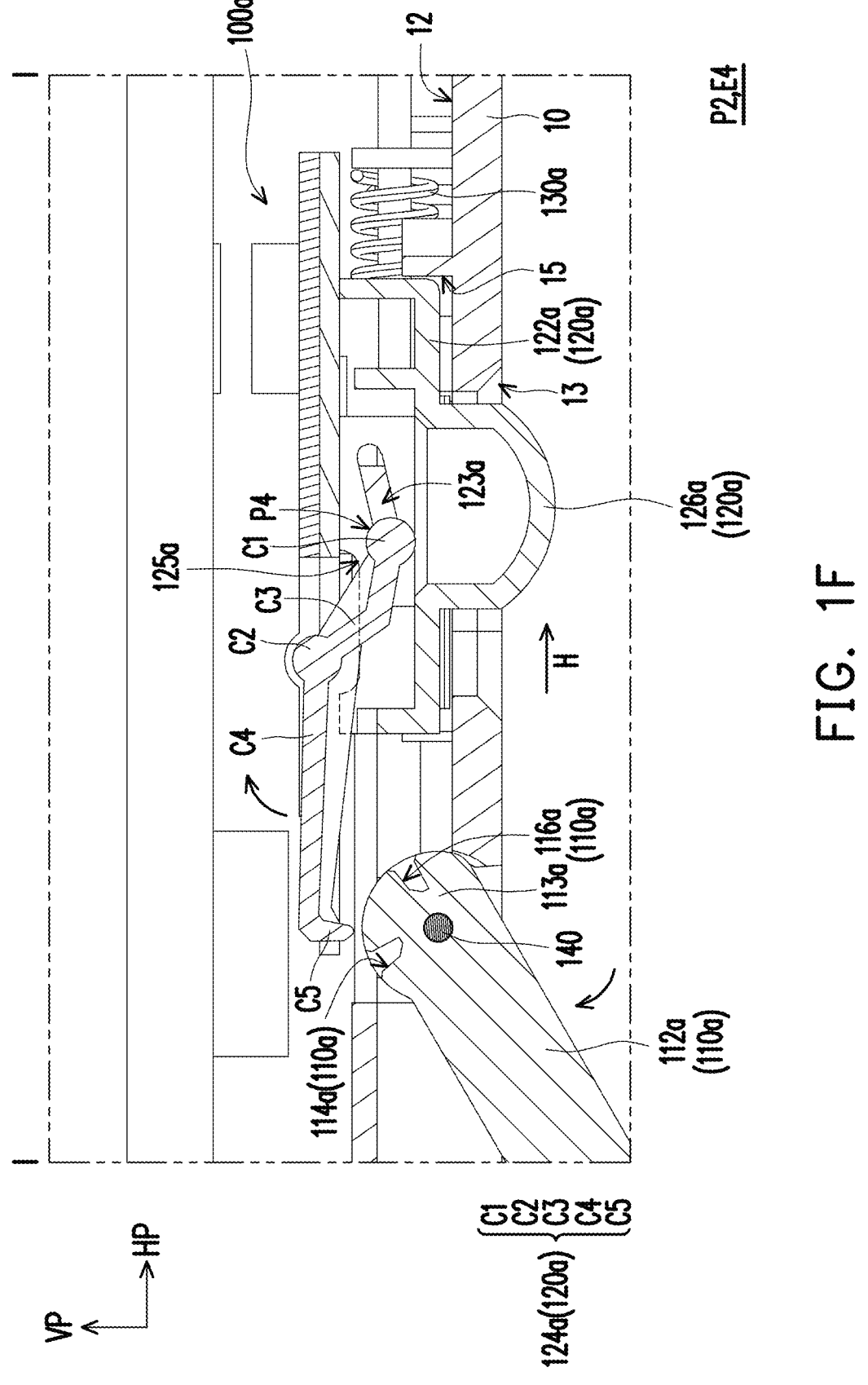
FIG. 1F is a schematic cross-sectional view of the support frame in the closing process along the line I-I in FIG. 1A.

FIG. 1A is a schematic three-dimensional view of a support frame supporting an electronic body according to an embodiment of the disclosure. FIG. 1B is a schematic cross-sectional view of the support frame in the closed state along the line I-I in FIG. 1A. FIG. 1C and FIG. 1D are schematic cross-sectional views of the support frame in the opening process along the line I-I in FIG. 1A. FIG. 1E is a schematic cross-sectional view of the support frame in the open state along the line I-I in FIG. 1A. FIG. 1F is a schematic cross-sectional view of the support frame in the closing process along the line I-I in FIG. 1A.

Please refer to FIG. 1A and FIG. 1B simultaneously. In this embodiment, the support frame 100a is suitable for supporting an electronic body 10. The support frame 100a includes a movable element 110a, a switch assembly 120a and an elastic assembly 130a. The movable element 110a includes a body 112a and a plurality of cavities, wherein the cavities include a first cavity 114a and a second cavity 116a. The first cavity 114a and the second cavity 116a are separated from each other and located on an end 113a of the body 112a. The end 113a of the body 112a is pivotally connected to the electronic body 10 and located in the electronic body 10. The switch assembly 120a includes a main body 122a, a cam 124a and a button 126a. The main body 122a and the cam 124a are disposed inside the electronic body 10 and located on a configuration plane 12 of the electronic body 10. The cam 124a is slidably disposed on the main body 122a, and the button 126a is connected to the main body 122a and exposed on the electronic body 10. The elastic assembly 130a is disposed in the electronic body 10 and at least connected between the switch assembly 120a and the electronic body 10.

Specifically, the electronic body 10 is, for example, a monitor, a tablet, a mobile phone, or a tablet screen, but is not limited thereto, and the support frame 100a is assembled on the electronic body 10 to support the electronic body 10. The configuration plane 12 of the electronic body 10 has an opening 13, and the button 126a of the switch assembly 120a passes through the opening 13 and is exposed to the electronic body 10, and the button 126a is suitable for moving parallel to the configuration plane 12 within the opening 13. That is to say, the button 126a can move horizontally along the configuration plane 12 of the electronic body 10 to present an open/closed state, which is a horizontal sliding unlocking. Herein, the plane perpendicular to the configuration plane 12 is defined as a vertical plane VP, and the plane parallel to the configuration plane 12 is defined as a horizontal plane HP. In one embodiment, the button 126a may have a rounded surface or a chamfered surface, which can make the horizontal movement smooth. In addition, the electronic body 10 further includes a limiting cavity 15, wherein the switch assembly 120a is born within in the limiting cavity 15, and the limiting cavity 15 can limit the movement of the switch assembly 120a within the opening 13.

In this embodiment, the movable element 110a is, for example, the legs of the frame, and there is an included angle A between the first cavity 114a and the second cavity 116a, in which the included angle A is, for example, greater than or equal to 90 degrees. It should be noted that, the position of the cavity may be adjusted to meet the needs of different closing or opening angles. In one embodiment, the opposite side walls of the cavity may be a combination of a curved wall and a vertical wall, respectively, the curved wall facilitates the embedding of the cam 124a, while the vertical wall prevents the movable element 110a from being pushed upward when the movable element 110a is shaken under force. Furthermore, the support frame 100a of this embodiment further includes a rotation shaft 140, which is connected to the electronic body 10 and passes through the end 113a of the movable element 110a. The movable element 110a rotates relative to the electronic body 10 with the rotation shaft 140 as the axis.

Please refer to FIG. 1A and FIG. 1B at the same time. The main body 122a of the switch assembly 120a of this embodiment has a pair of sliding slots 123a facing each other and a pair of configuration slots 125a facing each other, wherein the sliding slots 123a are paired and arranged correspondingly, and the configuration slots 125a are paired and arranged correspondingly. An extending direction L of the sliding slots 123a is inclined at an angle B relative to the configuration plane 12, which means that the sliding slots 123a in this embodiment are inclined sliding slots. An orthographic projection of the configuration slots 125a on the configuration plane 12 does not overlap an orthographic projection of the sliding slots 123a on the configuration plane 12. Furthermore, the cam 124a of the switch assembly 120a in this embodiment includes a first link C1, a second link C2, a linkage portion C3, a connection portion C4 and a cam portion C5. The two ends of the first link C1 are slidably installed in the sliding slots 123a, respectively. The two ends of the second link C2 are respectively disposed in the configuration slots 125a. The linkage portion C3 connects the first link C1 and the second link C2, and the connection portion C4 connects the second link C2 and the cam portion C5. Herein, the cam 124a is embodied as a link design, and the combination of the main body 122a and the cam 124a causes the cam 124a to move circularly in an arc trajectory. In addition, the elastic assembly 130a is, for example, two elastic elements, where each of the elastic elements 130a is, for example, a spring.

It should be noted that the slope of the sliding slots 123a can be determined based on the distance between the cavity of the movable element 110a and the button 126a, the available space height on the vertical plane VP, the retreat stroke of the button 126a, and the link arm length of the cam 124a. The smaller the slope of the sliding slots 123a, that is, the smoother it is, the smoother the hand feeling will be; conversely, the greater the slope of the sliding slots 123a will be, the relatively jerky hand feeling will be. Furthermore, the arm length formed by the connection portion C4 and the cam portion C5 of the cam 124a is limited by the height of the available space on the vertical plane VP; when the height is smaller, the arm length is shorter to avoid incomplete movement caused by interference from the upper structure. The length and angle of the two side walls of the first link C1 and the second link C2 of the cam 124a must be adjusted according to the cavity position of the movable element 110a and the height of the side wall of the button 126a. In addition, the cam portion C5 of the cam 124a should be vertical at the stop point, and an appropriate number of ribs can be added to enhance the structural strength of the cam portion C5.

Please refer to FIG. 1B again. In this embodiment, when the support frame 100a is in a closed state E1, the elastic assembly 130a pushes the switch assembly 120a so that the switch assembly 120a is in the first position P1. At this time, the first link C1 is in a third position P3 of the sliding slots 123a, and the cam portion C5 of the cam 124a rotates on the vertical plane VP perpendicular to the configuration plane 12 and is inserted into the first cavity 114a of the movable element 110a to limit rotation of the movable element 110a relative to the electronic body 10. That is to say, the movable element 110a can be fixed and contained in the electronic body 10 and cannot be rotated and automatically opened, which can prevent the movable element 110a from automatically opening in the closed state E1.

Next, please refer to FIG. 1B, FIG. 1C and FIG. 1D at the same time. When the support frame 100a is in an opening process E2, the user uses one hand to push the switch assembly 120a along a horizontal direction H parallel to the configuration plane 12 of the electronic body 10, so that the switch assembly 120a linearly moves to the second position P2 by resisting the elastic force of the elastic assembly 130a. At this time, the first link C1 slides from the third position P3 to a fourth position P4 along the sliding slots 123a, and links the cam portion C5 of the cam 124a to rotate on the vertical plane VP with the second link C2 as an axis to break away from the first cavity 114a, i.e., there is no stop, so that the user can use the other hand to open the movable element 110a, so that the movable element 110a rotates relative to the electronic body 10 and gradually expands from the electronic body 10.

After that, please refer to FIG. 1D and FIG. 1E at the same time. When the support frame 100a is in an open state E3, the elastic assembly 130a pushes the switch assembly 120a so that the switch assembly 120a is in the first position P1 again. At this time, the first link C1 slides from the fourth position P4 to the third position P3 along the sliding slots 123a, and links the cam portion C5 of the cam 124a to rotate on the vertical plane VP with the second link C2 as the axis to insert into the second cavity 116a of the movable element 110a to limit the rotation of the movable element 110a relative to the electronic body 10, so that the movable element 110a expands from the electronic body 10 to support the electronic body 10. That is to say, the movable element 110a can be fixed and expanded from the electronic body 10 to support the electronic body 10 and cannot be rotated and automatically closed, which can prevent the movable element 110a from automatically closing when in the open state E3.

Finally, please refer to FIG. 1E and FIG. 1F at the same time. When the support frame 100a is in a closing process E4, the user pushes the switch assembly 120a along the horizontal direction H with one hand, so that the switch assembly 120a linearly moves to the second position P2 by resisting the elastic force of the elastic assembly 130a. At this time, the first link C1 slides from the third position P3 to the fourth position P4 along the sliding slots 123a, and links the cam portion C5 of the cam 124a to rotate on the vertical plane VP with the second link C2 as the axis to break away from the second cavity 116a, i.e., there is no stop, so that the user can use the other hand to close the movable element 110a, so that the movable element 110a rotates relative to the electronic body 10 and gradually closes in the electronic body 10.

In the design of the support frame 100a in this embodiment, when the elastic assembly 130a pushes the switch assembly 120a so that the switch assembly 120a is in the first position P1, the cam 124a rotates on the vertical plane VP perpendicular to the configuration plane 12 and is inserted into the first cavity 114a or the second cavity 116a of the movable element 110a to limit the rotation of the movable element 110a relative to the electronic body 10; and when the switch assembly 120a linearly moves to the second position P2 by resisting the elastic force of the elastic assembly 130a, the cam 124a rotates on the vertical plane VP and breaks away from the first cavity 114a or the second cavity 116a of the movable element 110a, so that the movable element 110a rotates relative to the electronic body 10 to expand or close to the electronic body 10. That is to say, the support frame 100a of this embodiment adopts a fixed-axis fixed structure, and the movable element 110a can be fixed in a specific expanded or closed position through the elastic assembly 130a accumulating and releasing the mechanical energy. Furthermore, because the cam 124a can be inserted into the first cavity 114a or the second cavity 116a of the movable element 110a, it can not only provide greater strength to meet the usage situation, but also achieve a thinner effect. In addition, since the cam 124a of this embodiment is a link-type fixed structure that operates on the vertical plane VP, it can be used when the horizontal plane HP is limited, and the locking area can be increased to increase stability. In short, the support frame 100a of this embodiment has the advantages of being small and thin, and also has the advantage of low cost because it does not need to use a hinge-type movable element.

It has to be noted here that the following embodiment follows the reference numerals and part of the content of the aforementioned embodiment, in which the same reference numerals are used to represent the same or similar components, and descriptions of the same technical content are omitted. For descriptions of the omitted part, reference may be made to the aforementioned embodiment, and will not be repeated in the following embodiment.

Figure 2A:
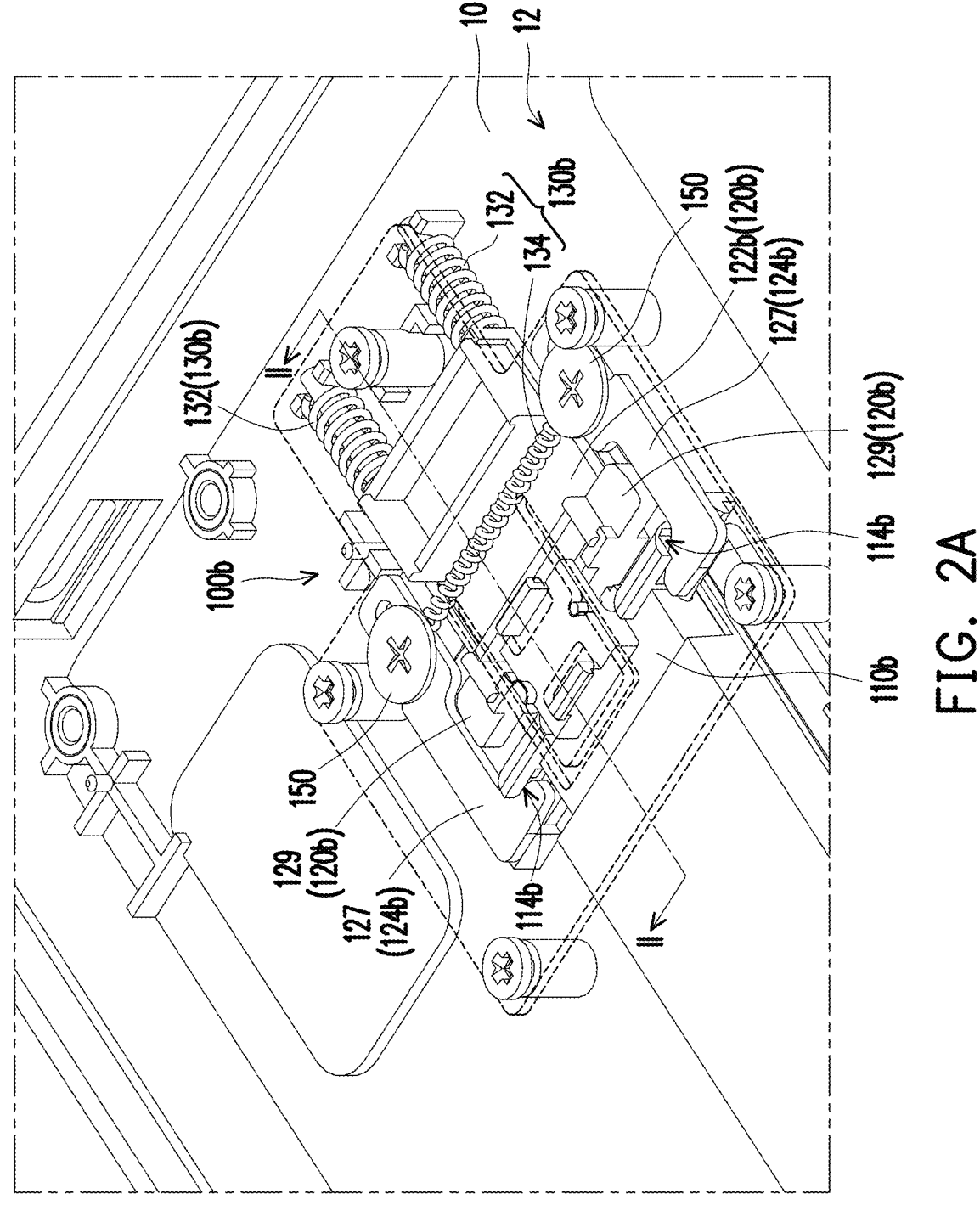
FIG. 2A is a schematic three-dimensional view of a support frame supporting an electronic body according to another embodiment of the disclosure.
Figure 2B:
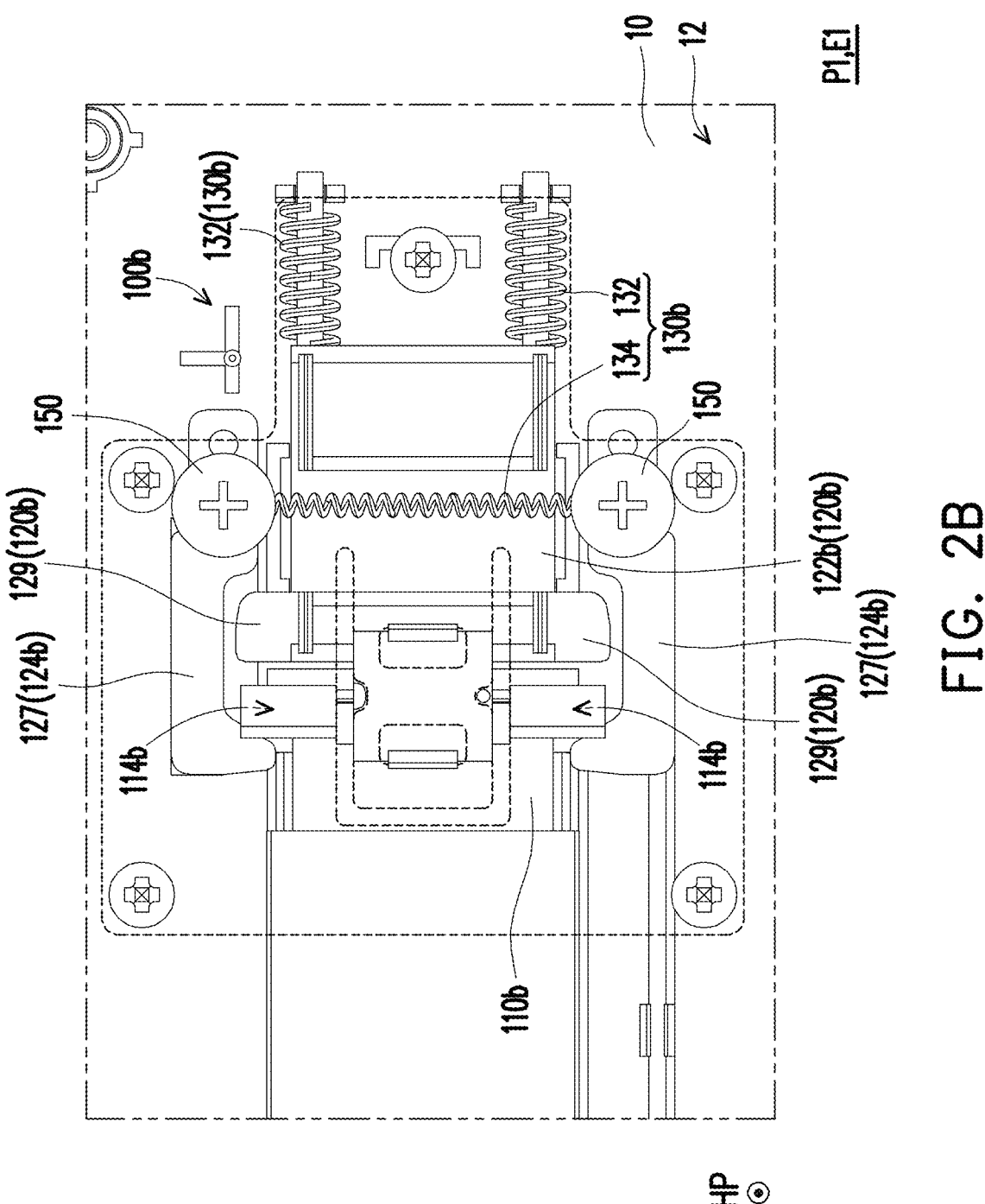
FIG. 2B is a schematic top view of the support frame in FIG. 2A in the closed state.
Figure 2C:
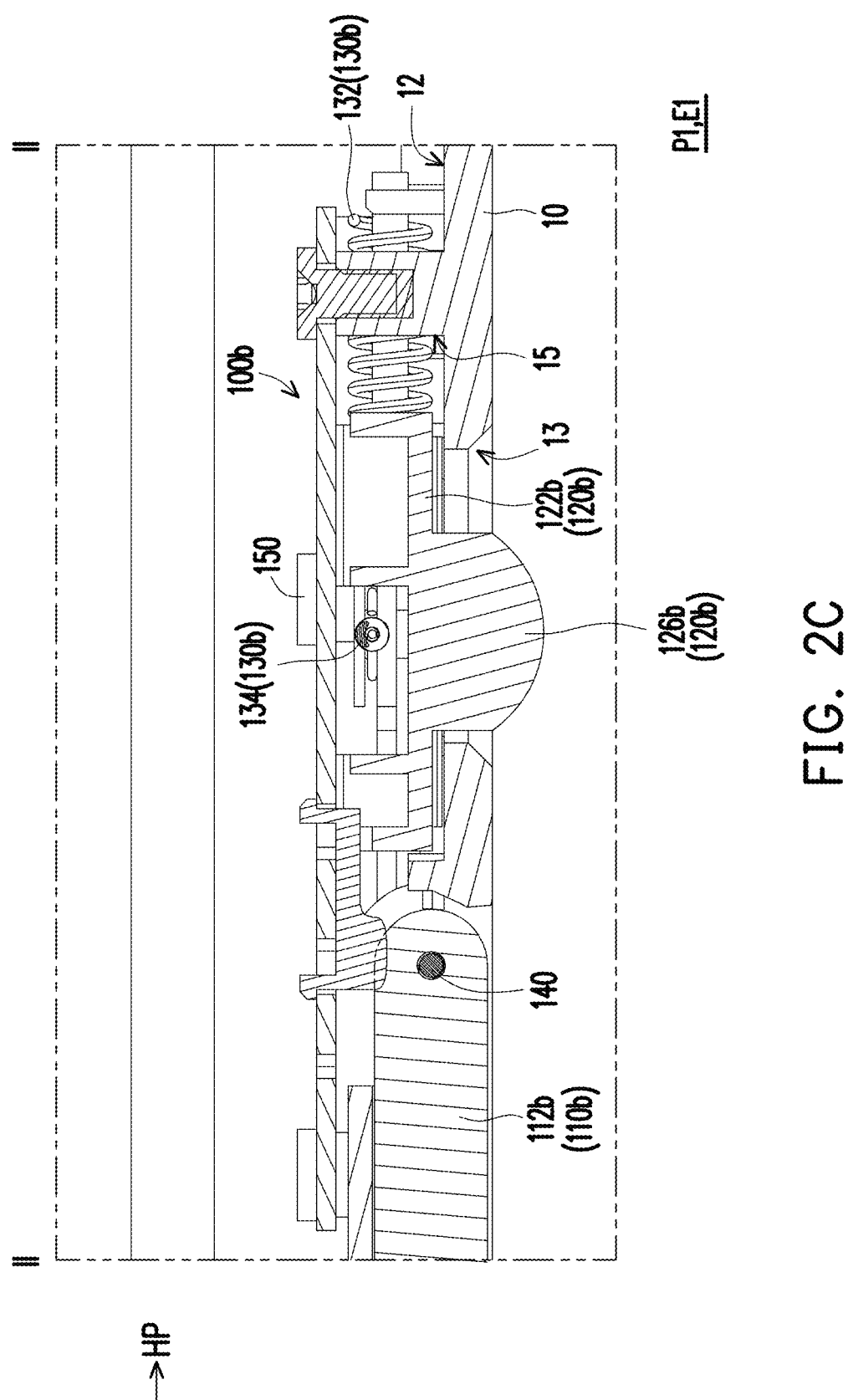
FIG. 2C is a schematic cross-sectional view of the support frame in the closed state along the line II-II in FIG. 2A.
Figure 2D:
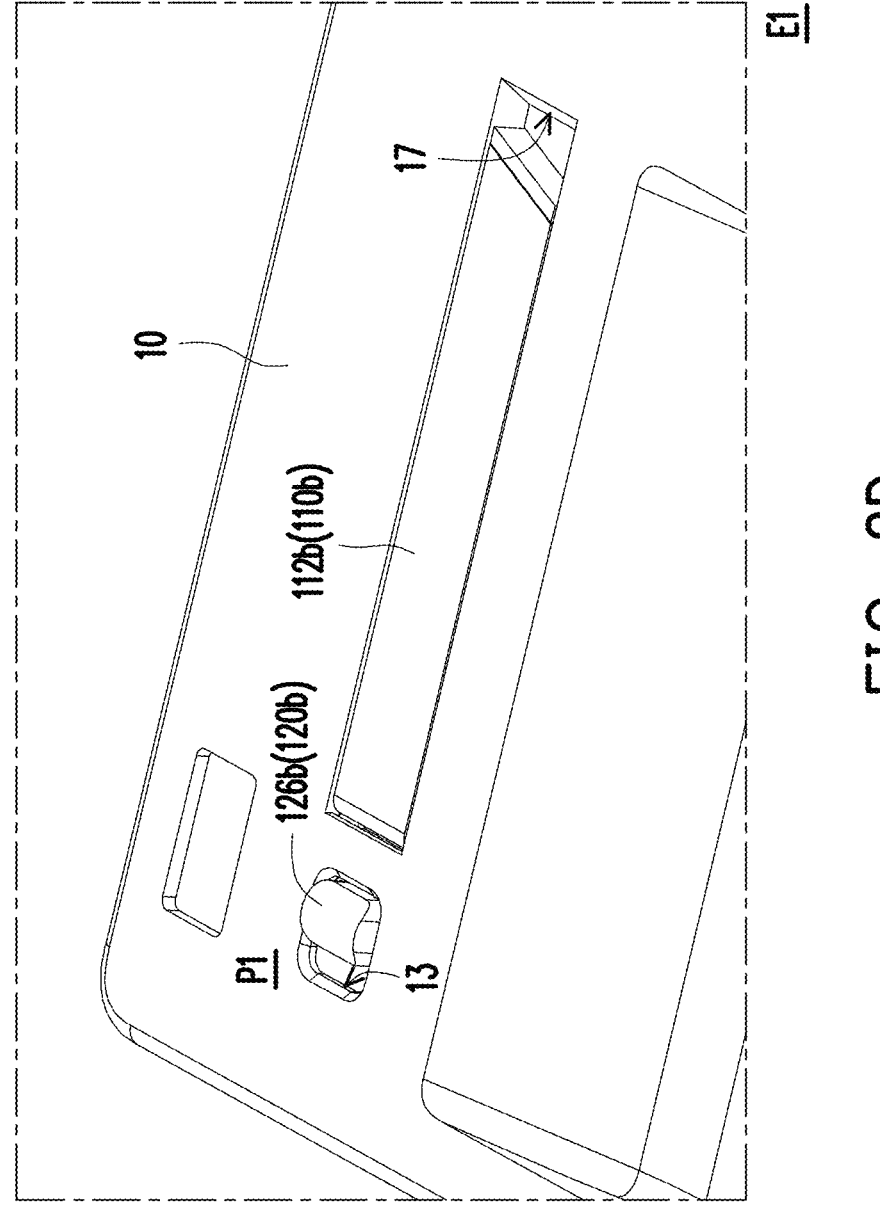
FIG. 2D is a schematic three-dimensional view of the support frame in FIG. 2A in the closed state.
Figure 2E:
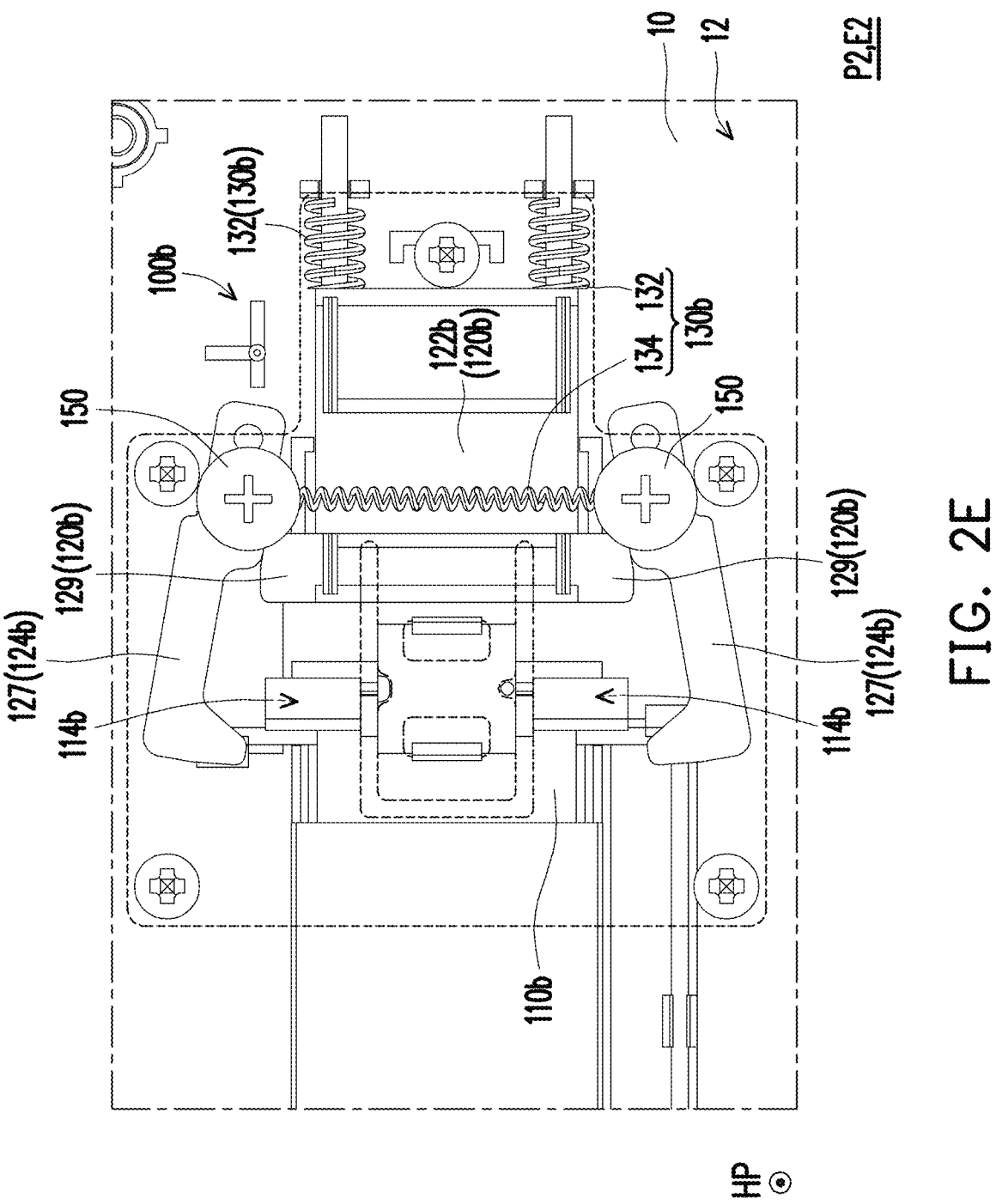
FIG. 2E is a schematic top view of the support frame in FIG. 2A in the opening process.
Figure 2F:
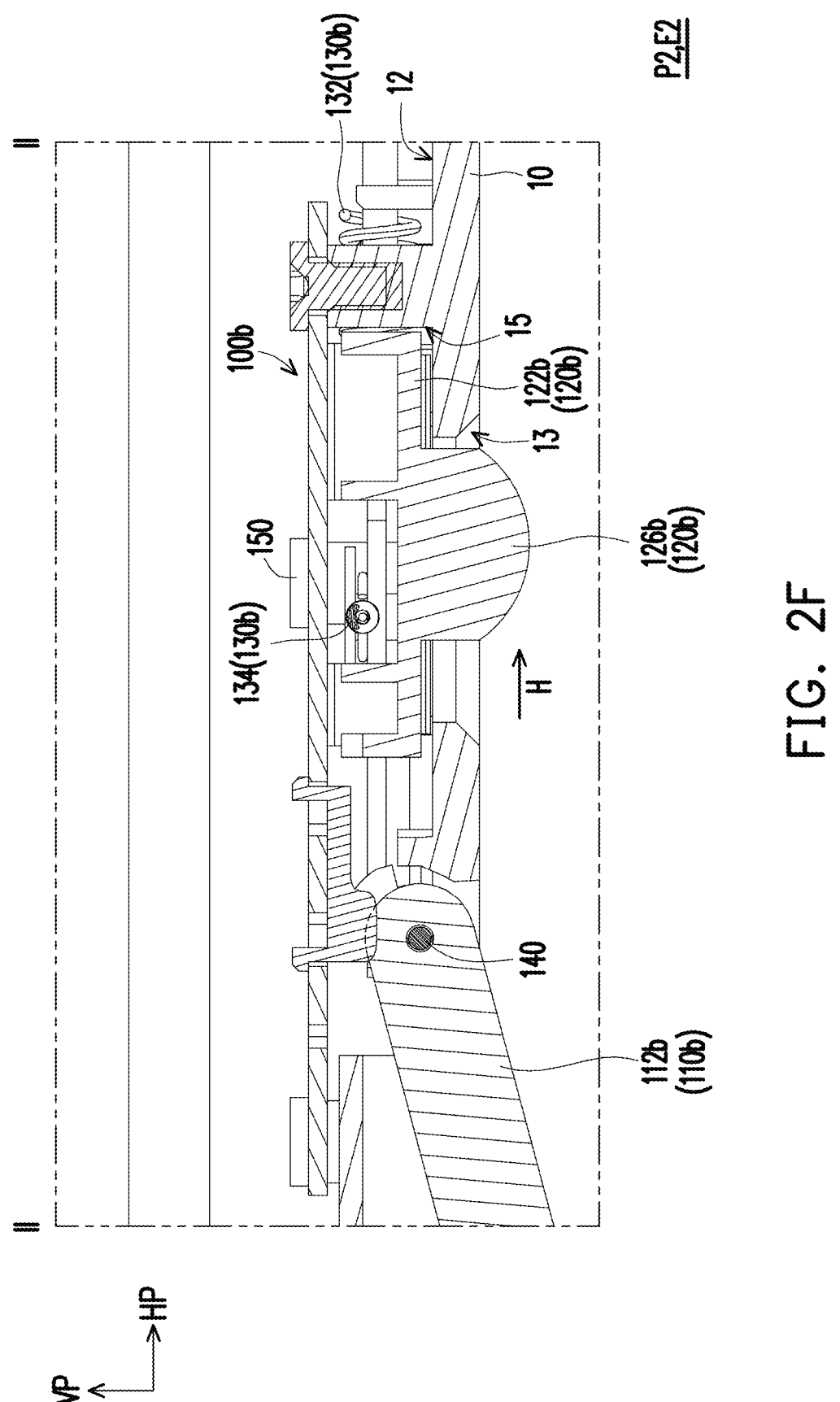
FIG. 2F is a schematic cross-sectional view of the support frame in the opening process along the line II-II in FIG. 2A.
Figure 2G:
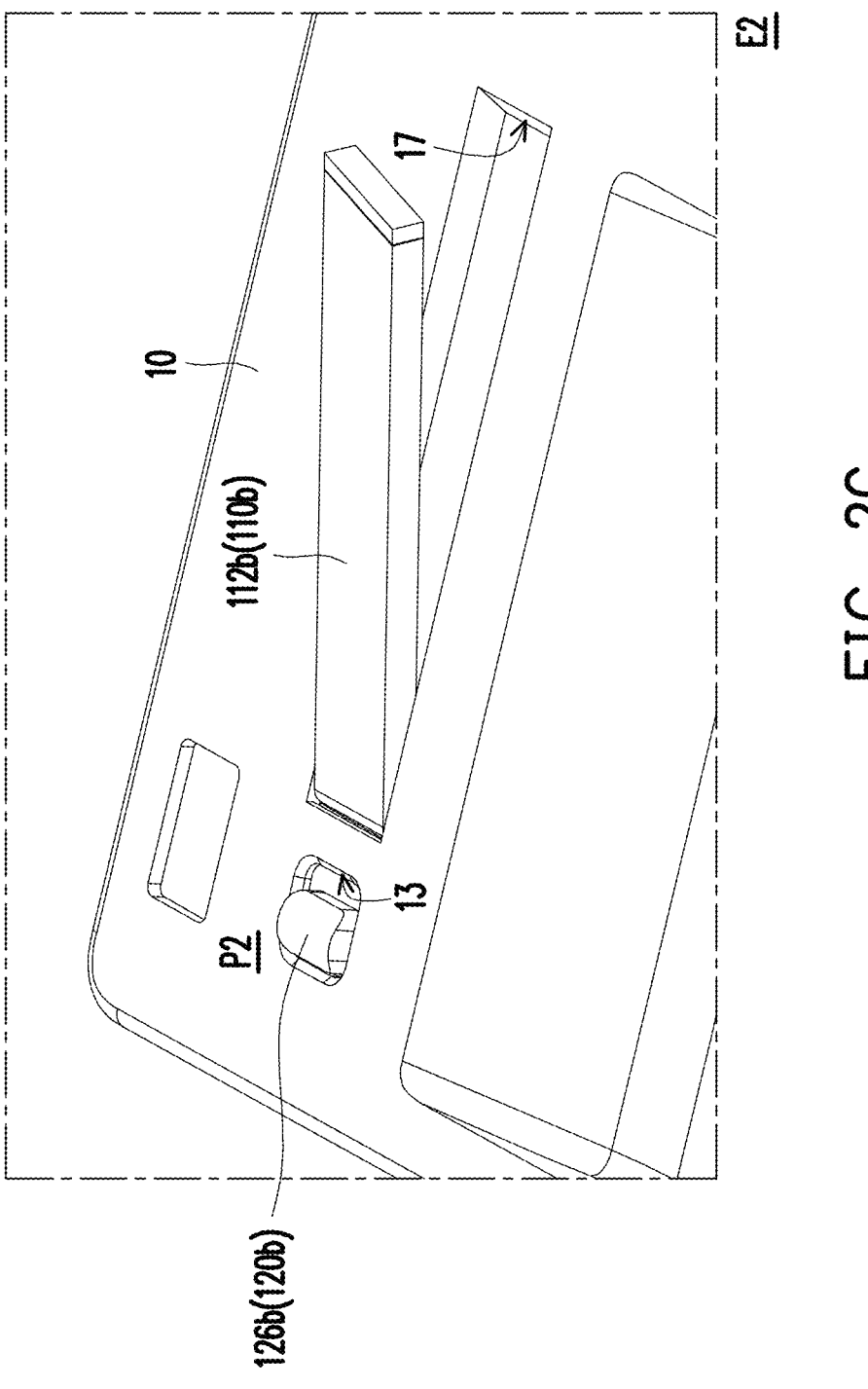
FIG. 2G is a schematic three-dimensional view of the support frame in FIG. 2A in the opening process.
Figure 2H:
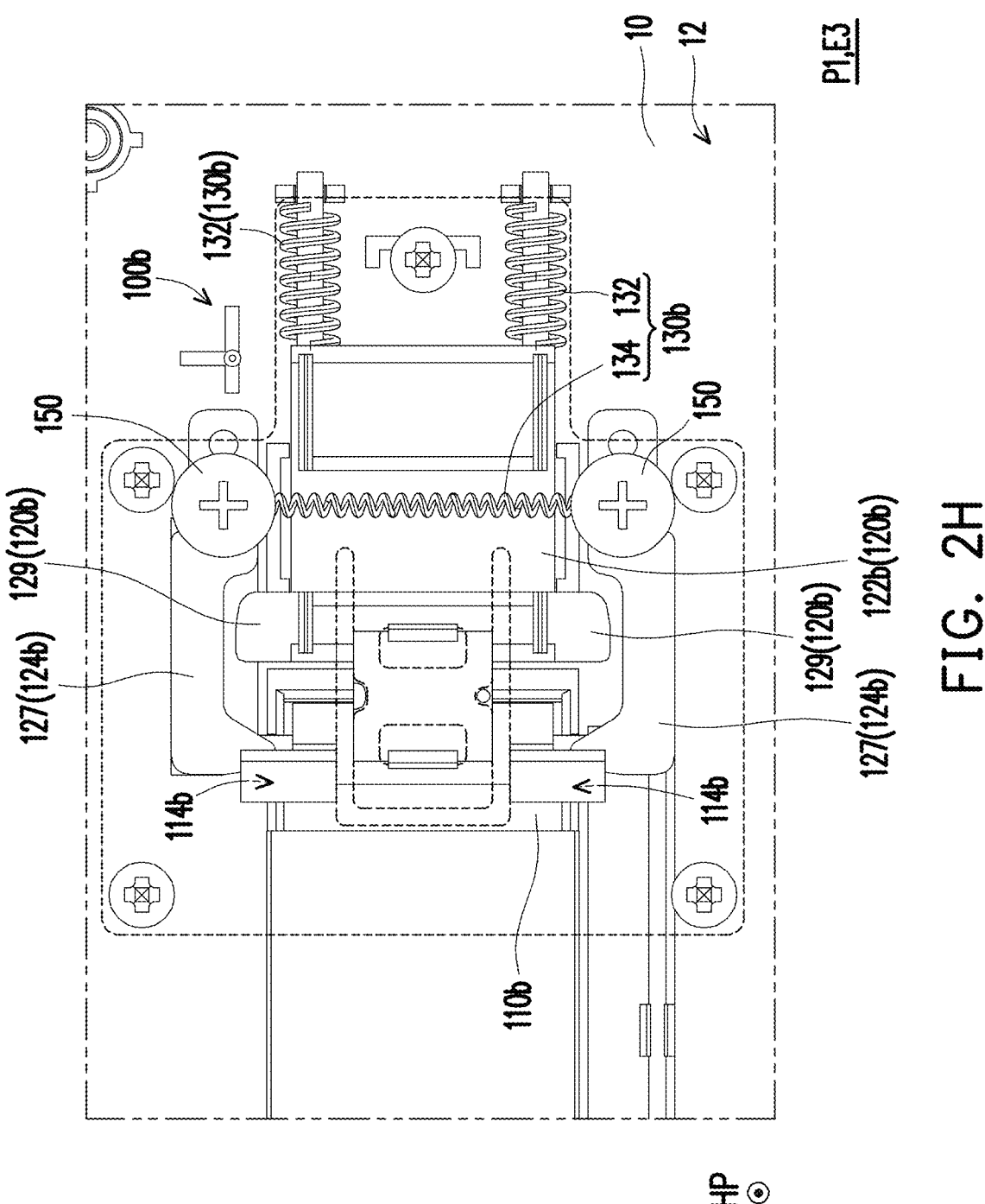
FIG. 2H is a schematic top view of the support frame in FIG. 2A in the open state.
Figure 2I:
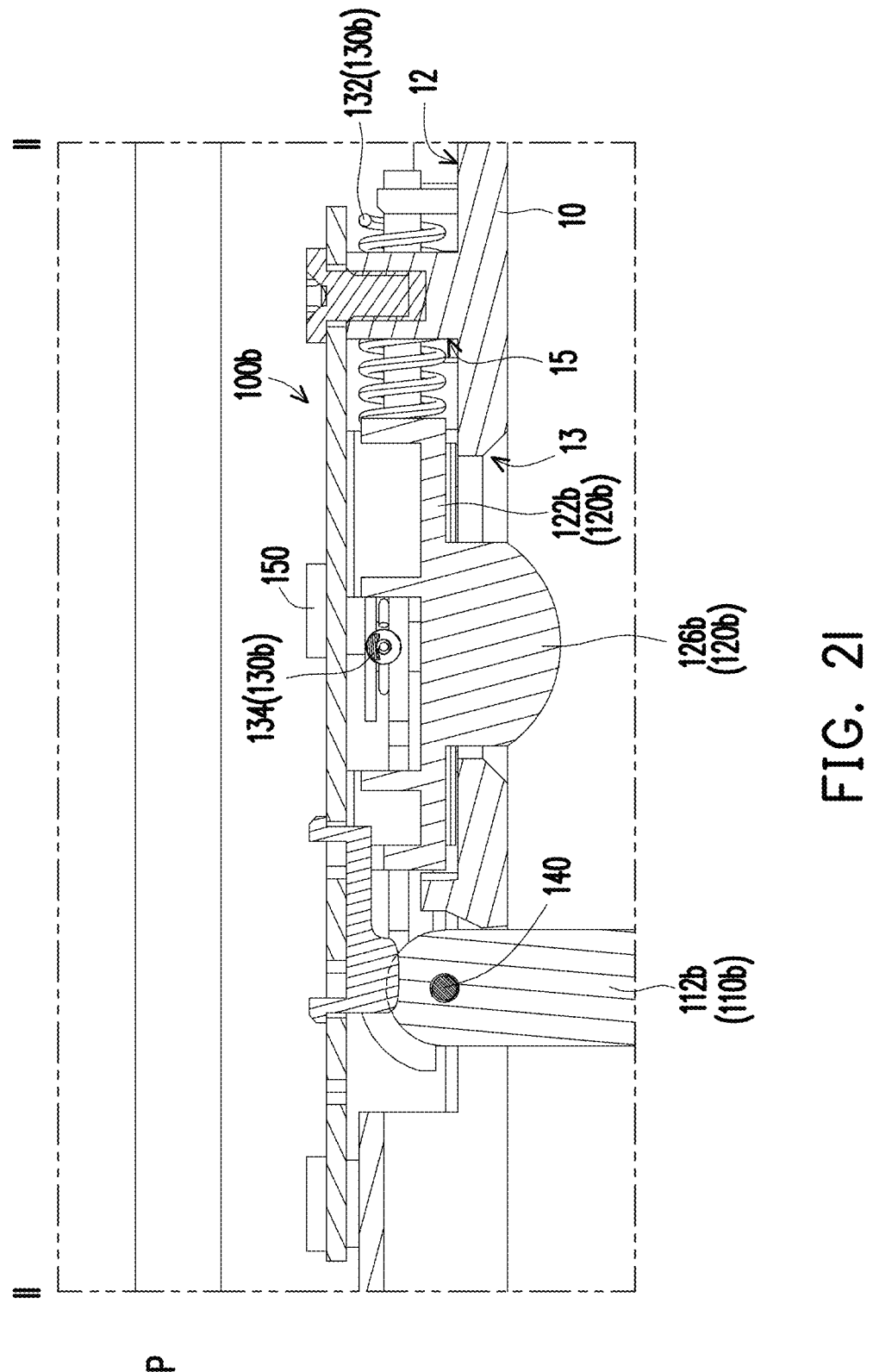
FIG. 2I is a schematic cross-sectional view of the support frame in the open state along the line II-II in FIG. 2A.
Figure 2J:
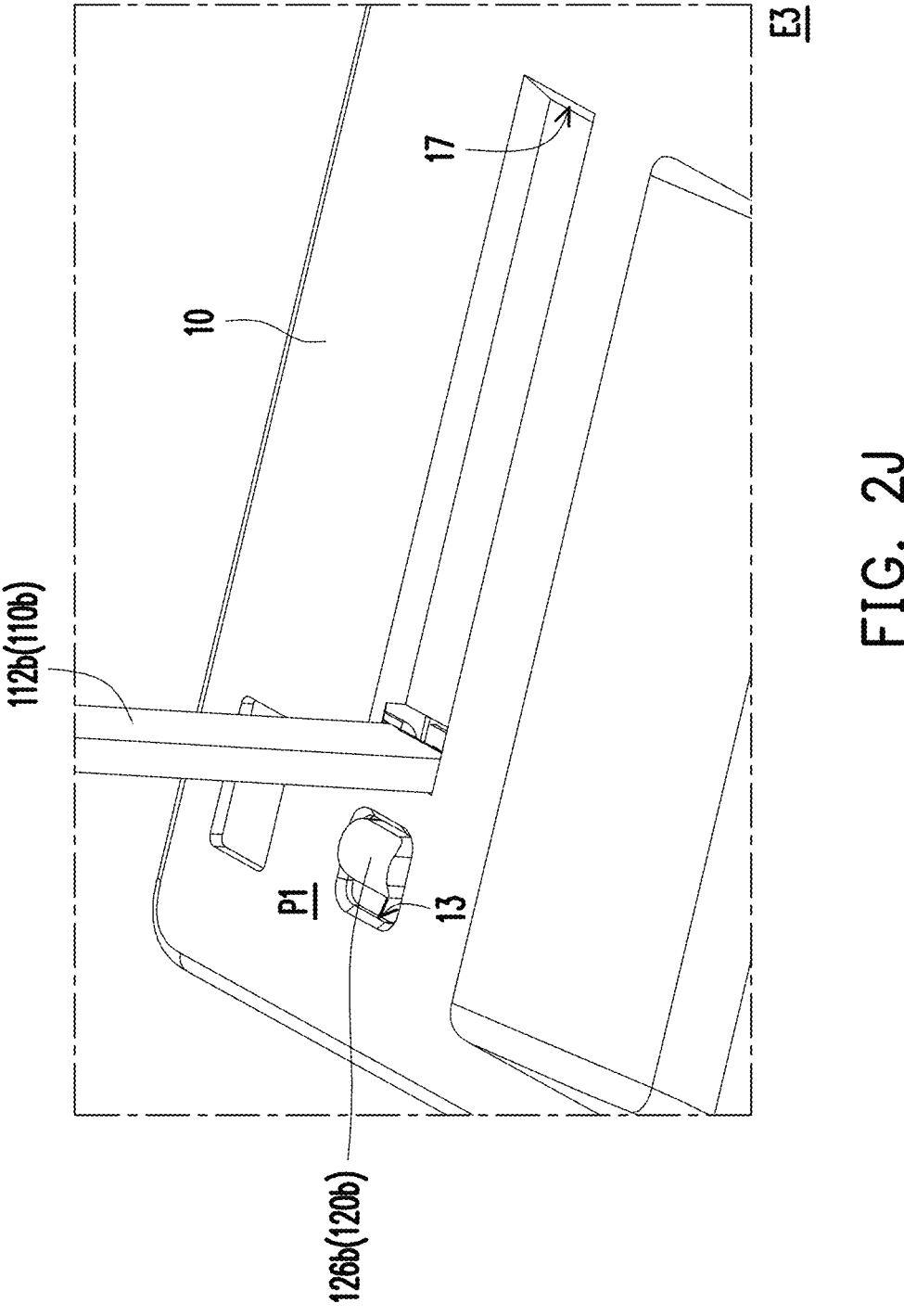
FIG. 2J is a schematic three-dimensional view of the support frame in FIG. 2A in the open state.
Figure 2K:
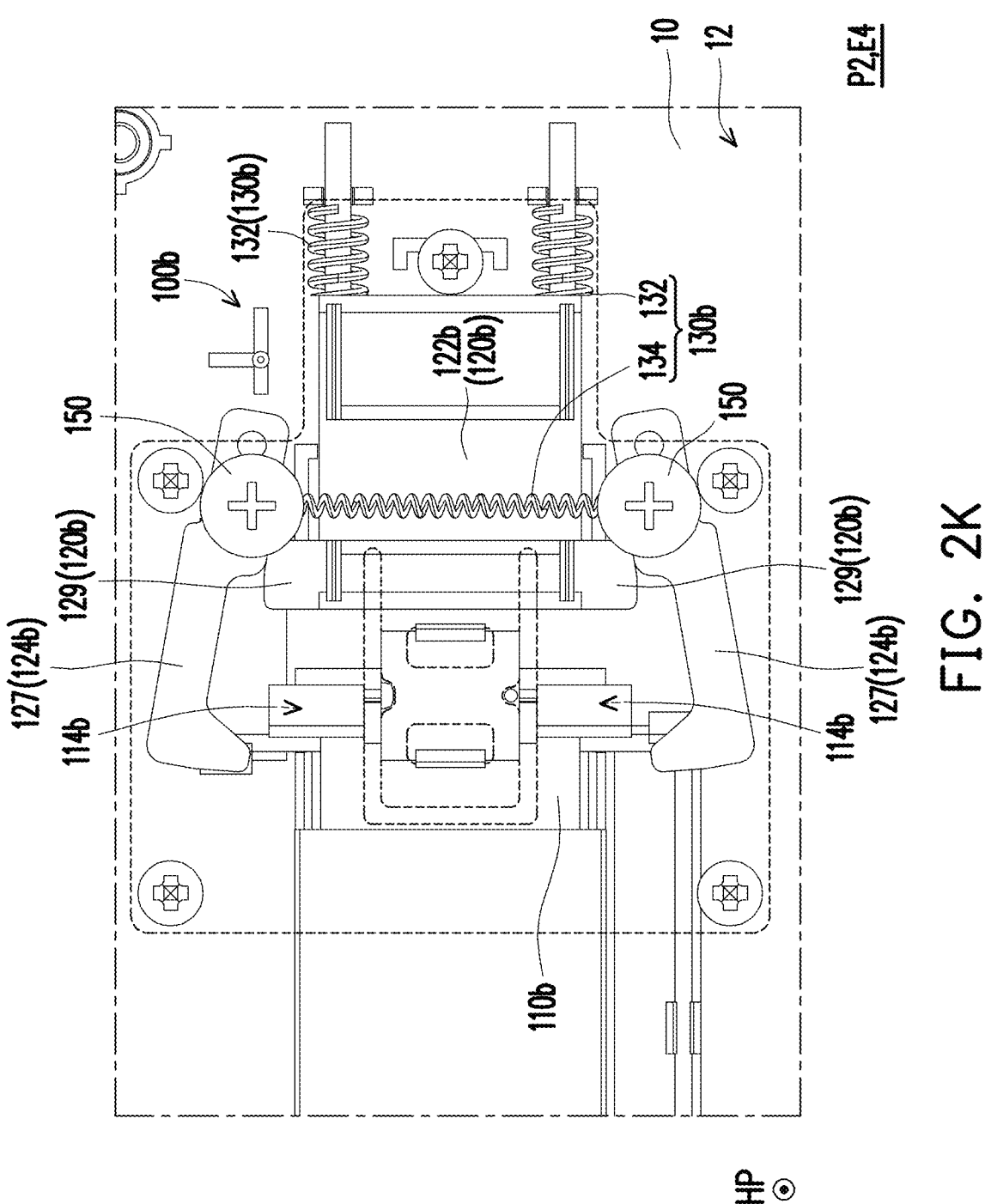
FIG. 2K is a schematic top view of the support frame in FIG. 2A in the closing process.
Figure 2L:
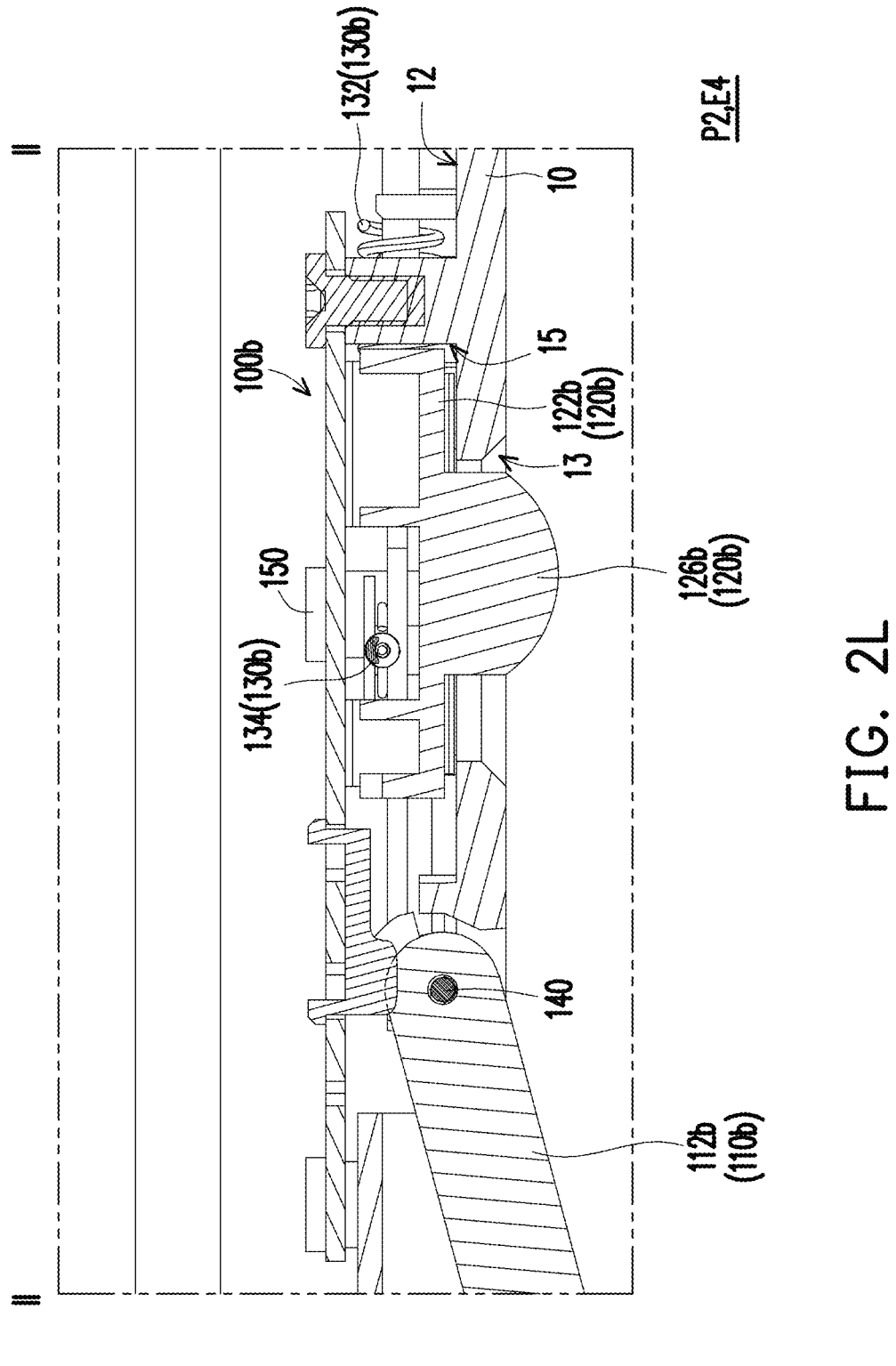
FIG. 2L is a schematic cross-sectional view of the support frame in the closing process along the line II-II of FIG. 2A.
Figure 2M:
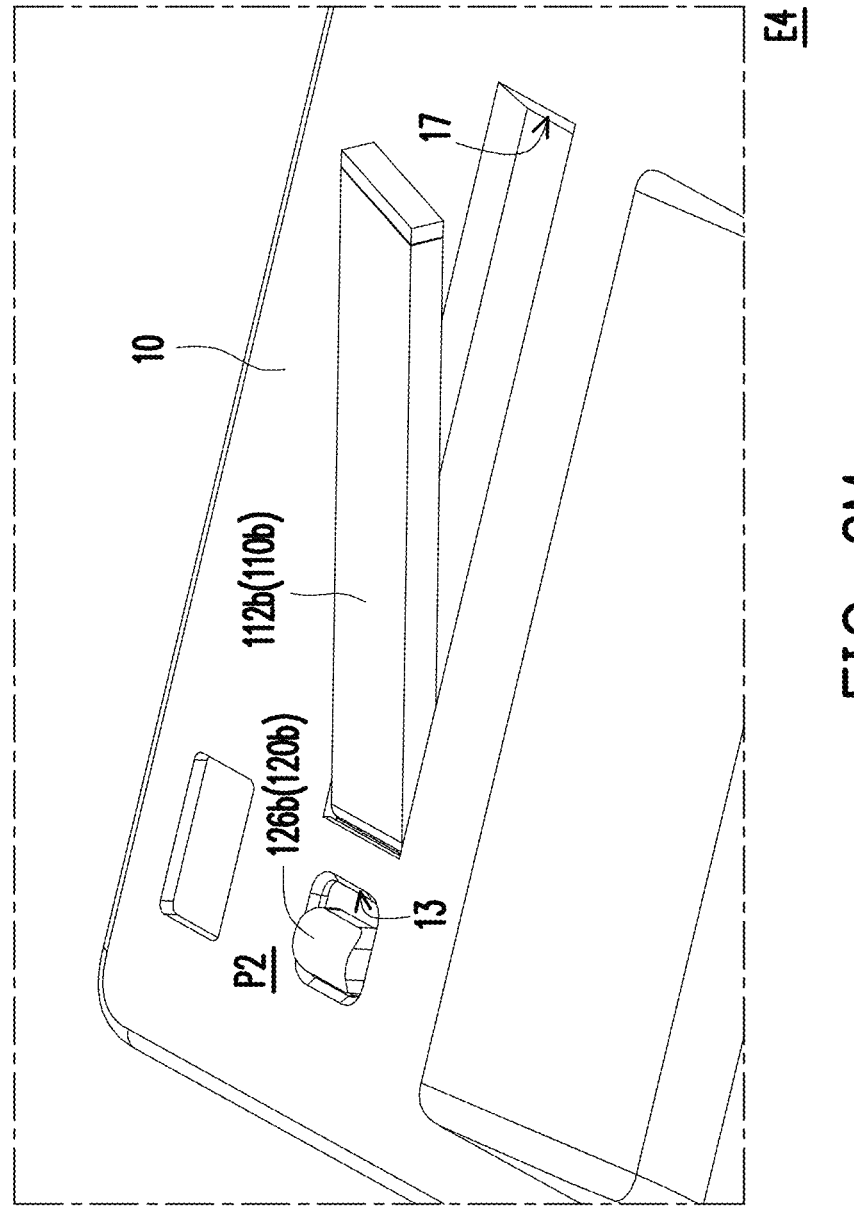
FIG. 2M is a schematic three-dimensional view of the support frame in FIG. 2A in the closing process.

FIG. 2A is a schematic three-dimensional view of a support frame supporting an electronic body according to another embodiment of the disclosure. FIG. 2B is a schematic top view of the support frame in FIG. 2A in the closed state. FIG. 2C is a schematic cross-sectional view of the support frame in the closed state along the line II-II in FIG. 2A. FIG. 2D is a schematic three-dimensional view of the support frame in FIG. 2A in the closed state. FIG. 2E is a schematic top view of the support frame in FIG. 2A in the opening process. FIG. 2F is a schematic cross-sectional view of the support frame in the opening process along the line II-II in FIG. 2A. FIG. 2G is a schematic three-dimensional view of the support frame in FIG. 2A in the opening process. FIG. 2H is a schematic top view of the support frame in FIG. 2A in the open state. FIG. 2I is a schematic cross-sectional view of the support frame in the open state along the line II-II in FIG. 2A. FIG. 2J is a schematic three-dimensional view of the support frame in FIG. 2A in the open state. FIG. 2K is a schematic top view of the support frame in FIG. 2A in the closing process. FIG. 2L is a schematic cross-sectional view of the support frame in the closing process along the line II-II of FIG. 2A. FIG. 2M is a schematic three-dimensional view of the support frame in FIG. 2A in the closing process.

Please refer to FIG. 1A, FIG. 1B, FIG. 2A, FIG. 2B and FIG. 2C at the same time. The support frame 100b of this embodiment is similar to the above-mentioned support frame 100a. The difference between the two is that, in this embodiment, the cam 124b of the switch assembly 120b includes two cam portions 127, wherein the cam portions 127 are located on opposite sides of the main body 122b, and the button 126b is connected to the main body 122b and exposed on the electronic body 10. Herein, the cam portions 127 are embodied as a caliper design. Taking balance into consideration, the design of the double calipers can disperse the force and avoid premature yielding of the material. Furthermore, the switch assembly 120b of this embodiment further includes two protruding portions 129 connected to opposite sides of the main body 122*b* and located between the main body 122*b* and the two cam portions 127. The cam portions 127 are respectively formed with recesses corresponding to the protruding portions 129, and the recesses have a longer shape in order to allow the button 126*b* to move. The inclination of the contact surface between the cam portions 127 and the button 126*b* and the smooth and excessive corners affect the damping feel. In addition, the shape of the ends of the cam portions 127 can be adjusted in size according to the space of the cavity 114*b*, wherein the larger the area of the ends of the cam portions 127, the better the fixing effect.

Furthermore, the cavities of the movable element 110*b* in this embodiment include two cavities 114*b*, which are respectively located on opposite sides of the main body 122*b* and disposed corresponding to the cam portions 127. When the protruding portions 129 push away the cam portions 127, the cam portions 127 can also center the button 126*b*, without causing a bad feel due to offset or even causing uneven wear on both sides of the material. In addition, the elastic assembly 130*b* of this embodiment includes two first elastic elements 132 and a second elastic element 134. The first elastic elements 132 are connected between the main body 122*b* of the switch assembly 120*b* and the electronic body 10. The second elastic element 134 is connected to the cam 124*b* of the switch assembly 120*b* to provide the clamping force of the cam portions 127 and can be used to fix the movable element 110*b*. In addition, the support frame 100*b* of this embodiment also includes two fixing elements 150, wherein the second elastic element 134 spans the main body 122*b* and connects to the cam portions 127, and the fixing elements 150 respectively fix the cam portions 127 and the second elastic element 134 on the configuration plane 12. The first elastic elements 132 and the second elastic element 134 are respectively a spring. It should be noted that when the K value of the second elastic element 134 is larger, the damping feeling of the button 126*b* is larger.

Please refer to FIG. 2B, FIG. 2C and FIG. 2D at the same time. In this embodiment, when the support frame 100*b* is in the closed state E1, the elastic assembly 130*b* pushes the switch assembly 120*b* so that the switch assembly 120*b* is in the first position P1. At this time, the cam portions 127 of the cam 124*b* rotate on the horizontal plane HP parallel to the configuration plane 12 and are respectively inserted into the cavities 114*b* of the movable element 110*b* to limit the rotation of the movable element 110*b* relative to the electronic body 10. That is to say, the movable element 110*b* can be fixed and contained in containing cavity 17 of the electronic body 10 and cannot be rotated and automatically opened, which can prevent the movable element 110*b* from automatically opening in the closed state E1.

Next, please refer to FIG. 2E, FIG. 2F and FIG. 2G at the same time. When the support frame 100*b* is in the opening process E2, the user uses one hand to push the switch assembly 120*b* along the horizontal direction H parallel to the configuration plane 12 of the electronic body 10, so that the switch assembly 120*b* linearly moves to the second position P2 by resisting the first elastic force of the first elastic elements 132. At this time, the protruding portions 129 respectively push the cam portions 127, so that the cam portions 127 resist the second elastic force of the second elastic element 134 and respectively rotate on the horizontal plane HP with the fixing elements 150 as the axes to break away from the cavities 114*b*, i.e., there is no stop, so that the user can use the other hand to open the movable element 110*b*, so that the movable element 110*b* rotates relative to the electronic body 10 and gradually expands from the electronic body 10.

After that, please refer to FIG. 2H, FIG. 2I and FIG. 2J at the same time. When the support frame 100*b* is in the open state E3, the first elastic elements 132 of the elastic assembly 130*a* push the switch assembly 120*b* so that the switch assembly 120*b* is in the first position P1. At this time, the cam portions 127 rotate on the horizontal plane HP with the fixing elements 150 as the axes through the second elastic force of the second elastic element 134 and are inserted into the cavities 114*b* of the movable element 110*b* to limit the rotation of the movable element 110*b* relative to the electronic body 10, so that the movable element 110*b* expands from the electronic body 10 to support the electronic body 10. That is to say, the movable element 110*b* can be fixed and expanded from the electronic body 10 to support the electronic body 10 and cannot be rotated and automatically closed, which can prevent the movable element 110*b* from automatically closing when in the open state E3.

Finally, please refer to FIG. 2K, FIG. 2L and FIG. 2M at the same time. When the support frame 100*b* is in the closing process E4, the user pushes the switch assembly 120*b* with one hand, so that the switch assembly 120*b* linearly moves to the second position P2 by resisting the first elastic force of the first elastic elements 132. At this time, the protruding portions 129 respectively push the cam portions 127, so that the cam portions 127 resist the second elastic force of the second elastic element 134 and respectively rotate on the horizontal plane HP with the fixing members 150 as the axis to break away from the cavities 114*b*, i.e., there is no stop, so that the user can use the other hand to close the movable element 110*b*, so that the movable element 110*b* rotates relative to the electronic body 10 and gradually closes in the containing cavity 17 of the electronic body 10.

In the design of the support frame 100*b* in this embodiment, when the elastic assembly 130*b* pushes the switch assembly 120*b* so that the switch assembly 120*b* is in the first position P1, the cam 124*b* rotates on the horizontal plane HP parallel to the configuration plane 12 and is inserted into the cavities 114*b* of the movable element 110*b* to limit the rotation of the movable element 110*b* relative to the electronic body 10; and when the switch assembly 120*b* linearly moves to the second position P2 by resisting the elastic force of the elastic assembly 130*b*, the cam 124*b* rotates on the horizontal plane HP and breaks away from the cavities 114*b* of the movable element 110*b*, so that the movable element 110*b* rotates relative to the electronic body 10 to expand or close to the electronic body 10. That is to say, the support frame 100*b* of this embodiment adopts a fixed-axis fixed structure, and the movable element 110*b* can be fixed in a specific expanded or closed position through the elastic assembly 130*b* accumulating and releasing the mechanical energy. Furthermore, because the cam 124*b* can be inserted into the cavities 114*b* of the movable element 110*b*, it can not only provide greater strength to meet the use situation, but also achieve a thinner effect. In addition, the cam 124*b* of this embodiment is a caliper-type folding mechanism, which operates on the horizontal plane HP, so it can be used when the vertical plane VP is limited, and the clamping area can be increased to increase stability. In short, the support frame 100*b* of this embodiment has the advantages of being small and thin. Furthermore, it does not need to use a hinge-type movable element, so it has the advantage of low cost.

To sum up, in the design of the support frame according to the disclosure, when the elastic assembly pushes the switch assembly so that the switch assembly is in a first position, the cam rotates on a vertical plane perpendicular to the configuration plane or a horizontal plane parallel to the configuration plane and is inserted into at least one cavities of the movable element to limit rotation of the movable element relative to the electronic body; and when the switch assembly linearly moves to a second position by resisting an elastic force of the elastic assembly, the cam rotates on the vertical plane or the horizontal plane and breaks away from at least one cavities of the movable element, so that the movable element rotates relative to the electronic body to expand or close to the electronic body. That is to say, in the support frame according to the disclosure, the movable element can be fixed in a specific expanded or closed position through the elastic assembly accumulating and releasing the mechanical energy, thereby achieving the purpose of being small in size and low in cost.

Although the disclosure has been disclosed by the embodiments, the embodiments are not intended to limit the disclosure. Persons with ordinary knowledge in the technical field may make some changes and modifications without departing from the spirit and scope of the disclosure. Therefore, the scope of protection of the disclosure shall be determined by the appended claims.

What is claimed is:

1. A support frame suitable for supporting an electronic body, the support frame comprising: a movable element comprising a body and a plurality of cavities, wherein the plurality of cavities are separated from each other and located on the body, an end of the body is pivotally connected to the electronic body and located in the electronic body; a switch assembly comprising a main body, a cam and a button, wherein the main body and the cam are disposed inside the electronic body and located on a configuration plane of the electronic body, the cam is slidably disposed on the main body or located next to the main body, and the button is connected to the main body and exposed on the electronic body; and an elastic assembly disposed in the electronic body and at least connected between the switch assembly and the electronic body, wherein when the elastic assembly pushes the switch assembly so that the switch assembly is in a first position, the cam rotates on a vertical plane perpendicular to the configuration plane or a horizontal plane parallel to the configuration plane and is inserted into at least one of the plurality of cavities of the movable element to limit rotation of the movable element relative to the electronic body, and when the switch assembly linearly moves to a second position by resisting an elastic force of the elastic assembly, the cam rotates on the vertical plane or the horizontal plane and breaks away from at least one of the plurality of cavities of the movable element, so that the movable element rotates relative to the electronic body to expand from or close to the electronic body; and the configuration plane of the electronic body has an opening, the button passes through the opening and is exposed on the electronic body, and the button is suitable for moving parallel to the configuration plane within the opening.

2. The support frame as claimed in claim 1, wherein the electronic body further comprises a limiting cavity, the switch assembly is born within the limiting cavity, and the limiting cavity limits movement of the switch assembly within the opening.

3. The support frame as claimed in claim 1, wherein the button has a rounded surface or a chamfered surface.

4. The support frame as claimed in claim 1, wherein the plurality of cavities comprise a first cavity and a second cavity, an included angle is between the first cavity and the second cavity, and the included angle is greater than or equal to 90 degrees.

5. The support frame as claimed in claim 4, wherein the main body of the switch assembly has a pair of sliding slots and a pair of configuration slots, an extending direction of the pair of the sliding slots is inclined at an angle relative to the configuration plane, and an orthographic projection of the pair of configuration slots on the configuration plane does not overlap an orthographic projection of the pair of sliding slots on the configuration plane.

6. The support frame as claimed in claim 5, wherein the cam comprises a first link, a second link, a linking portion, a connection portion and a cam portion, the first link is slidably installed in the pair of sliding slots, and the second link is disposed in the pair of configuration slots, the linking portion connects the first link and the second link, and the connection portion connects the second link and the cam portion.

7. The support frame as claimed in claim 6, wherein when the support frame is in a closed state, the switch assembly is in the first position, the first link is in a third position of the pair of sliding slots, and the cam portion is inserted into the first cavity of the movable element.

8. The support frame as claimed in claim 7, wherein when the support frame is in an opening process, the switch assembly linearly moves to the second position by resisting the elastic force of the elastic assembly, the first link slides from the third position to a fourth position along the pair of sliding slots, and links the cam portion to rotate on the vertical plane with the second link as an axis to break away from the first cavity, so that the movable element rotates relative to the electronic body and gradually expands from the electronic body.

9. The support frame as claimed in claim 8, wherein when the support frame is an open state, the elastic assembly pushes the switch assembly so that the switch assembly is in the first position, the first link slides from the fourth position to the third position along the pair of sliding slots, links the cam portion to rotate on the vertical plane with the second link as the axis to insert into the second cavity of the movable element, and the movable element expands from the electronic body to support the electronic body.

10. The support frame as claimed in claim 9, wherein when the support frame is a closing process, the switch assembly linearly moves to the second position by resisting the elastic force of the elastic assembly, the first link slides from the third position to the fourth position along the pair of sliding slots, and links the cam portion to rotate on the vertical plane with the second link as the axis to break away from the second cavity, so that the movable element rotates relative to the electronic body and gradually closes in the electronic body.

11. The support frame as claimed in claim 1, wherein the elastic assembly comprises two elastic elements, and each of the two elastic elements is a spring.

12. The support frame as claimed in claim 1, wherein the elastic assembly comprises two first elastic elements and a second elastic element, the two first elastic elements are connected between the main body of the switch assembly and the electronic body, and the second elastic element is connected to the cam of the switch assembly.

13. The support frame as claimed in claim 12, further comprising:
two fixing elements, wherein the cam comprises two cam portions located next to the main body, the second elastic element spans the main body and connects the two cam portions, and the two fixing elements respectively fix the two cam portions and the second elastic element on the configuration plane.

14. The support frame as claimed in claim 13, wherein the switch assembly further comprises two protruding portions connected to opposite sides of the main body and located between the main body and the two cam portions, and the plurality of cavities comprise two cavities located on opposite sides of the main body and disposed corresponding to the two cam portions.

15. The support frame as claimed in claim 14, wherein when the support frame is in a closed state, the switch assembly is in the first position, the two cam portions are respectively inserted into the two cavities of the movable element, and the movable element is contained in a containing cavity of the electronic body.

16. The support frame as claimed in claim 15, wherein when the support frame is in an opening process, the switch assembly linearly moves to the second position by resisting a first elastic force of the two first elastic elements, the two protruding portions respectively push the two cam portions, so that the two cam portions resist a second elastic force of the second elastic element and respectively rotate on the horizontal plane with the two fixing elements as axis to break away from the two cavities, so that the movable element rotates relative to the electronic body and gradually expands from the electronic body.

17. The support frame as claimed in claim 16, wherein when the support frame is an open state, the two first elastic elements push the switch assembly so that the switch assembly is in the first position, the two cam portions rotate on the horizontal plane with the two fixing elements as the axes through the second elastic force of the second elastic element and are inserted into the two cavities of the movable element, so that the movable element expands from the electronic body to support the electronic body.

18. The support frame as claimed in claim 17, wherein when the support frame is a closing process, the switch assembly linearly moves to the second position by resisting the first elastic force of the two first elastic elements, the two protruding portions respectively push the two cam portions, so that the two cam portions resist the second elastic force of the second elastic element and respectively rotate on the horizontal plane with the two fixing elements as the axis to break away from the two cavities, so that the movable element rotates relative to the electronic body and gradually closes in the electronic body.

19. The support frame as claimed in claim 12, wherein the two first clastic elements and the second elastic element are respectively a spring.

* * * * *